United States Patent
Parthasarathy et al.

(10) Patent No.: US 9,076,807 B2
(45) Date of Patent: Jul. 7, 2015

(54) OVERVOLTAGE PROTECTION FOR MULTI-CHIP MODULE AND SYSTEM-IN-PACKAGE

(75) Inventors: Srivatsan Parthasarathy, Acton, MA (US); Charly El-Khoury, Andover, MA (US); Francisco Santos, Arlington, MA (US); Nathan R. Carter, Santa Clara, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 378 days.

(21) Appl. No.: 13/610,509

(22) Filed: Sep. 11, 2012

(65) Prior Publication Data

US 2014/0071566 A1   Mar. 13, 2014

(51) Int. Cl.
| | |
|---|---|
| *H02H 9/00* | (2006.01) |
| *H01L 23/60* | (2006.01) |
| *H01L 23/62* | (2006.01) |
| *H01L 23/50* | (2006.01) |
| *H01L 25/065* | (2006.01) |

(52) U.S. Cl.
CPC ............... *H01L 23/60* (2013.01); *H01L 23/62* (2013.01); *H01L 2224/48091* (2013.01); *H01L 2224/48137* (2013.01); *H01L 2224/49175* (2013.01); *H01L 23/50* (2013.01); *H01L 25/0655* (2013.01); *H01L 2924/13034* (2013.01); *H01L 2924/1305* (2013.01)

(58) Field of Classification Search
USPC ............................................... 361/56
See application file for complete search history.

(56) References Cited

U.S. PATENT DOCUMENTS

| | | | | |
|---|---|---|---|---|
| 5,731,945 | A * | 3/1998 | Bertin et al. ................... | 361/111 |
| 2009/0121220 | A1* | 5/2009 | Lin ................................. | 257/48 |
| 2009/0290271 | A1* | 11/2009 | Yang et al. .................... | 361/56 |
| 2010/0001363 | A1* | 1/2010 | Frye et al. ..................... | 257/491 |
| 2010/0128402 | A1* | 5/2010 | Besse et al. .................... | 361/56 |
| 2010/0165522 | A1* | 7/2010 | Stockinger et al. ............. | 361/56 |
| 2011/0261542 | A1* | 10/2011 | Lim .............................. | 361/752 |
| 2012/0002392 | A1* | 1/2012 | Karp et al. .................... | 361/820 |
| 2013/0063843 | A1* | 3/2013 | Chen et al. .................... | 361/56 |
| 2014/0071566 | A1* | 3/2014 | Parthasarathy et al. ......... | 361/56 |
| 2014/0346651 | A1* | 11/2014 | Xiang et al. ................... | 257/659 |

* cited by examiner

*Primary Examiner* — Ronald W Leja
(74) *Attorney, Agent, or Firm* — Knobbe, Martens, Olson & Bear LLP

(57) ABSTRACT

In one embodiment, an apparatus includes a package that encompasses at least a first integrated circuit die and a second integrated circuit die. The first integrated circuit die is attached to the package and includes one or more electrical overstress/electrostatic discharge (EOS/ESD) protection circuits. The second integrated circuit die is attached to the package and electrically coupled to the first integrated circuit die such that at least one component of the second integrated circuit die is protected from EOS/ESD by the first integrated circuit die.

20 Claims, 9 Drawing Sheets

OVERVOLTAGE PROTECTION FOR MULTI-CHIP MODULE AND SYSTEM-IN-PACKAGE

BACKGROUND

1. Field

Embodiments of the invention relate to electronic systems, and more particularly, to overvoltage protection for integrated circuits in integrated circuit packages.

2. Description of the Related Technology

Certain electronic systems can be exposed to a transient electrical event, or an electrical signal of a relatively short duration having rapidly changing voltage and high power. Transient electrical events can include, for example, electrical overstress/electrostatic discharge (EOS/ESD) events arising from the abrupt release of charge from an object or person to an electronic system.

Transient electrical events can damage integrated circuits (ICs) of an electronic system due to overvoltage conditions and/or high levels of power dissipation over relatively small areas of the ICs. High power dissipation can increase IC temperature, and ESD can lead to numerous other problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC.

SUMMARY

For purposes of summarizing the disclosure, certain aspects, advantages and novel features of the inventions have been described herein. It is to be understood that not necessarily all such advantages can be achieved in accordance with any particular embodiment of the inventions disclosed herein. Thus, the inventions disclosed herein can be embodied or carried out in a manner that achieves or optimizes one advantage or group of advantages as taught herein without necessarily achieving other advantages as can be taught or suggested herein.

In accordance with some embodiments, an apparatus can include a package, a first integrated circuit die, and a second integrated circuit die. The package can encompass at least the first integrated circuit die and the second integrated circuit die. The first integrated circuit die can be attached to the package, and the first integrated circuit die can include one or more electrical overstress/electrostatic discharge (EOS/ESD) protection circuits. The second integrated circuit die can be attached to the package, and the second integrated circuit die can be electrically coupled to the first integrated circuit die such that at least one component of the second integrated circuit die can be protected from EOS/ESD by the first integrated circuit die.

The apparatus of the preceding paragraph can include a combination of one or more of the following features: The first integrated circuit die further can include functional integrated circuits, and the second integrated circuit die further can include functional integrated circuits and its own one or more EOS/ESD protection circuits. Each functional integrated circuit of the first integrated circuit die and the second integrated circuit die can include an amplifier, an oscillator, a mixer, a filter, a phase-locked loop, a modulator, a demodulator, an encoder, a decoder, signal processor, an equalizer, a receiver, a transmitter, a timer, a microprocessor, a memory, or a converter. The first integrated circuit die further can include functional integrated circuits, and the second integrated circuit die further can include an integrated passive devices die. The second integrated circuit die can be electrically coupled to the first integrated circuit die with bond wires. Power supply connections of the second integrated circuit die can be electrically coupled to the first integrated circuit die. Power supply connections of the second integrated circuit die can be electrically coupled to power supply connections of the first integrated circuit die with bond wires. Power supply connections of the second integrated circuit die can be electrically coupled to power supply connections of the first integrated circuit die with one or more diodes or one or more silicon-controlled rectifiers. The power supply connections of the first integrated circuit die can be configured to operate at first voltages, and the power supply connections of the second integrated circuit die can be configured to operate at second voltages different than the first voltages. The one or more diodes can be configured to operate in reverse-bias mode.

In some embodiments, a method of providing protection from electrical overstress/electrostatic discharge (EOS/ESD) is disclosed. The method can include assembling at least a first integrated circuit die and a second integrated circuit die within a common package. The first integrated circuit die can include one or more EOS/ESD protection circuits. Further, the method can include protecting at least one component of the second integrated circuit die with at least one EOS/ESD protection circuit of the first integrated circuit die.

The method of the preceding paragraph can include a combination of one or more of the following features: The first integrated circuit die further can include functional integrated circuits, and the second integrated circuit die further can include functional integrated circuits and its own one or more EOS/ESD protection circuits. Each functional integrated circuit of the first integrated circuit die and the second integrated circuit die can include an amplifier, an oscillator, a mixer, a filter, a phase-locked loop, a modulator, a demodulator, an encoder, a decoder, signal processor, an equalizer, a receiver, a transmitter, a timer, a microprocessor, a memory, or a converter. The first integrated circuit die further can include functional integrated circuits, and the second integrated circuit die further can include an integrated passive devices die. The second integrated circuit die can be electrically coupled to the first integrated circuit die with bond wires. Power supply connections of the second integrated circuit die can be electrically coupled to the first integrated circuit die. Power supply connections of the second integrated circuit die can be electrically coupled to power supply connections of the first integrated circuit die with bond wires. Power supply connections of the second integrated circuit die can be electrically coupled to power supply connections of the first integrated circuit die with one or more diodes or one or more silicon-controlled rectifiers. The power supply connections of the first integrated circuit die can be configured to operate at first voltages, and the power supply connections of the second integrated circuit die can be configured to operate at second voltages different than the first voltages. The one or more diodes can be configured to operate in reverse-bias mode.

DETAILED DESCRIPTION OF EMBODIMENTS

Figure 1:
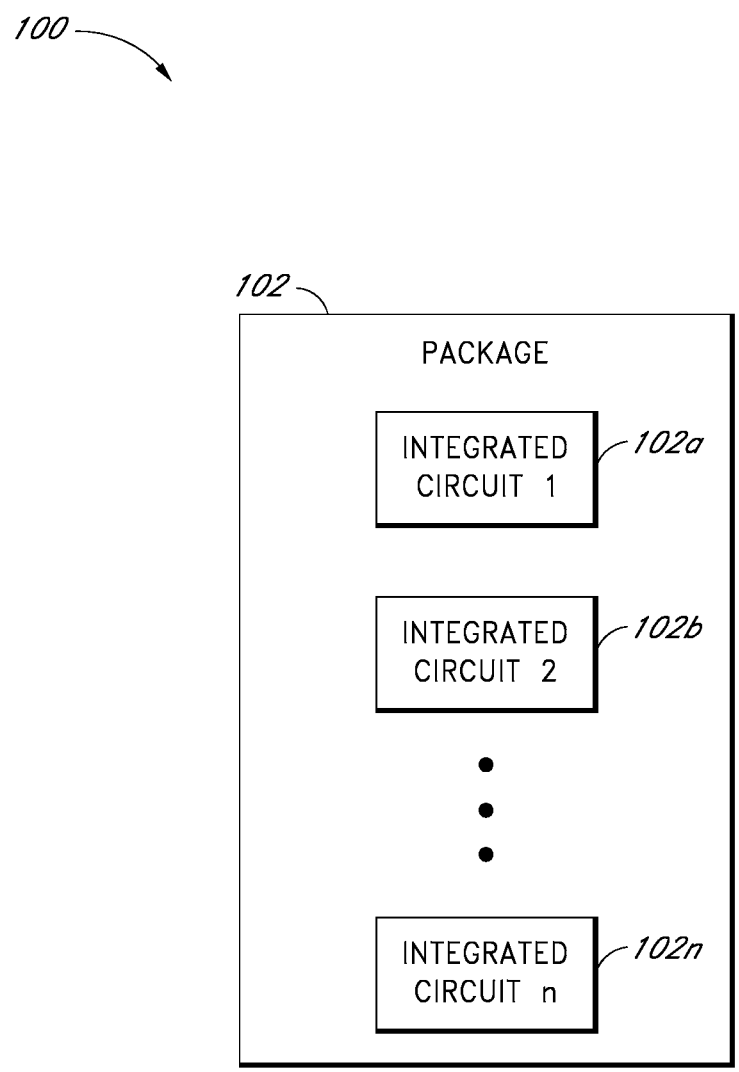
FIG. 1 is a block diagram of an example integrated circuit assembly that includes multiple integrated circuits within the same package.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Multiple active and passive integrated circuit (IC) dice can be included in an IC package or lead frame that encapsulates or encompasses the IC dice to form an IC assembly. As used herein, the term "IC assembly" includes an IC package and the IC dice encapsulated within the IC package. The IC package can enable integration of different IC dice as a single unit, such as a system on a chip, which may be connected to other components. Moreover, the IC package can provide a support for the multiple IC dice that prevents physical damage and corrosion and provides electrical contacts for coupling the IC assembly to other components.

The connection pins of an IC package can be exposed to transient electrical events, such as electrical overstress/electrostatic discharge (EOS/ESD) events, which can damage one or more IC dice in the IC package. A transient electrical event can be a rapidly changing high energy signal or associated with an overvoltage event caused by, for example, user contact with the IC package. Various standards set by various organizations, such as the Joint Electronic Device Engineering Council (JEDEC), the International Electrotechnical Commission (IEC), and the Automotive Engineering Council (AEC) exist for testing ESD susceptibility. To provide protection against transient electrical events, various approaches can be used to protect one or more IC dice in an IC package. In this disclosure, transient electrical events and EOS/ESD events can hereafter be referred to and used interchangeably to explain exposure to the same events.

In some systems, the EOS/ESD protection for an IC assembly is provided external to the IC assembly and is electrically connected to a board to which the IC package of the IC assembly is also connected. The EOS/ESD protection external to the IC assembly can include components such as one or more zener diodes or transient voltage suppressors. When the IC assembly is exposed to an EOS/ESD event, the EOS/ESD protection can provide a discharge path for the EOS/ESD other than through the IC assembly. However, the addition of the EOS/ESD protection external to the IC assembly increases number of components in a system and can further increase the cost and size of the system. Moreover, in such a configuration, the IC assembly by itself may not meet the requirements of a particular ESD testing standard, which can impact the commercial value of the IC assembly.

In some systems, a dedicated EOS/ESD protection IC die is packaged with the IC assembly and serves the sole function of providing EOS/ESD protection for one or more other IC dice in the IC package. The dedicated EOS/ESD protection IC die can provide a discharge path for current caused by an EOS/ESD event through the IC package that avoids one or more other IC dice. However, the addition of the dedicated EOS/ESD protection IC die increases the number of components of the IC assembly and can increase the cost and size of a system. Moreover, the dedicated EOS/ESD protection IC die can increase fabrication complexity, time, and risk and require modifying the IC package or bonding options to support the dedicated EOS/ESD protection IC die. In addition, the dedicated EOS/ESD protection IC die can introduce parasitics in a system and impact the functionality of other IC dice included in the IC package.

In some systems, an EOS/ESD protection element is incorporated into each of one or more individual IC dice packaged with an IC assembly. However, because the EOS/ESD protection elements can provide varying levels or kinds of EOS/ESD protection, one or more IC dice having an EOS/ESD protection element can be more vulnerable to EOS/ESD events than other IC dice of the IC assembly. As a result, when current from an EOS/ESD event passes from one connection pin of a package to another connection pin of the package through various IC dice, one or more of the IC dice in the package may be less able to protect against damage from the EOS/ESD event.

Advantageously, in certain embodiments discussed in this disclosure, one or more active or passive IC dice of an IC assembly are connected to share EOS/ESD protection elements. For example, a high speed amplifier (HSA) IC die can be connected to a current feedback amplifier (CFA) IC die so that at least one component of the CFA IC die is protected from an EOS/ESD event by an EOS/ESD protection element of the HSA IC die. By sharing EOS/ESD protection elements, the number of components included in an IC assembly can be reduced, and the cost and size of a system can decrease. In addition, increased EOS/ESD protection can be provided to one or more IC dice of the IC package, resulting in a greater overall robustness of the IC assembly and fewer EOS/ESD related failures of one or more individual IC die. Further, the costs of stringent controls to prevent EOS/ESD events can be reduced since fewer EOS/ESD-related failures may occur.

FIG. 1 is a block diagram of an example of an IC assembly 100 that includes an IC package 102 and multiple IC dies 102a, 102b, ..., 102n encapsulated within the IC package 102. The IC package 102 can enable integration of the multiple IC dice 102a, 102b, ..., 102n as a single unit, which can be further connected to other components through the electrical contacts of IC package 102. The IC package 102 can provide support for the multiple IC dice 102a, 102b, ..., 102n to prevent physical damage and corrosion of the multiple IC dice 102a, 102b, ..., 102n. In certain embodiments, the use of an IC package 102 can advantageously reduce a board level parasitic for a system and enable placement of the multiple IC dies 102a, 102b, ..., 102n in a smaller area than using other approaches.

The IC package 102 can correspond to, for example, system-in-packages (SiP) or multi-chip modules (MCM), or the like. A SiP can be an IC package in which one or more IC dies are stacked vertically in the IC package, and an MCM can be an IC package in which one or more IC dies are placed horizontally beside one another. In some embodiments, the one or more IC dies can be mounted together on a common substrate in the IC package 102. Other forms of IC packaging of multiple dice will be applicable.

The multiple IC dice 102a, 102b, ..., 102n included in the IC package 102 can comprise various components or perform various functions. In some embodiments, IC dice can be classified as active IC dice or passive IC dice based on the component parts of the IC dice or the functions performed by the IC dice. Active IC dice can include circuit components such as transistors or diodes and function as functional elements, EOS/ESD protection (ESDP) elements, or connector elements. Passive IC dice can include passive elements such as resistors, inductors, or capacitors that are components of an integrated passive device (IPD) die.

Since the multiple IC dice 102a, 102b, ..., 102n can include different components or perform different functions, each IC die may have one or more different ESDP elements (not shown) designed to protect the IC die from exposure to EOS/ESD events. Two or more of the IC die may have been designed at different times, under different constraints, and using different approaches, so some EOS/ESD protection elements can be better able to protect an IC die from EOS/ESD exposure than others. Further, different IC die designs can different receive EOS/ESD protection ratings based on the one or more different EOS/ESD protection elements of the IC die design. In some embodiments, an EOS/ESD protection rating is a value indicative of the degree of or characteristics of protection from exposure to transient electrical events provided by a EOS/ESD protection element, and a higher EOS/ESD protection rating can correspond to greater protection from exposure to EOS/ESD events and a reduced likelihood that an EOS/ESD event results in failure or damage of an IC die. EOS/ESD protection ratings can be compared to EOS/ESD ratings specifications, such as the human body model (HBM) and charged device model (CDM) specifications. The EOS/ESD ratings specifications can provide standards for robustness of IC dice or packages for use in particular applications, such as medical applications, for instance.

Advantageously, in certain embodiments, one or more IC dice of the multiple IC dice 102a, 102b, ..., 102n within a common package of the IC assembly can be connected to share EOS/ESD protection elements. In particular, one or more IC dice having some or better EOS/ESD protection capabilities or higher EOS/ESD protection ratings can be connected to other IC dice to provide EOS/ESD protection to the other IC dice. The multiple IC dice 102a, 102b, ..., 102n can be connected in such a way to minimally or negligibly impact performance of the IC dies of the IC package 102 that share EOS/ESD protection elements.

Figure 2:
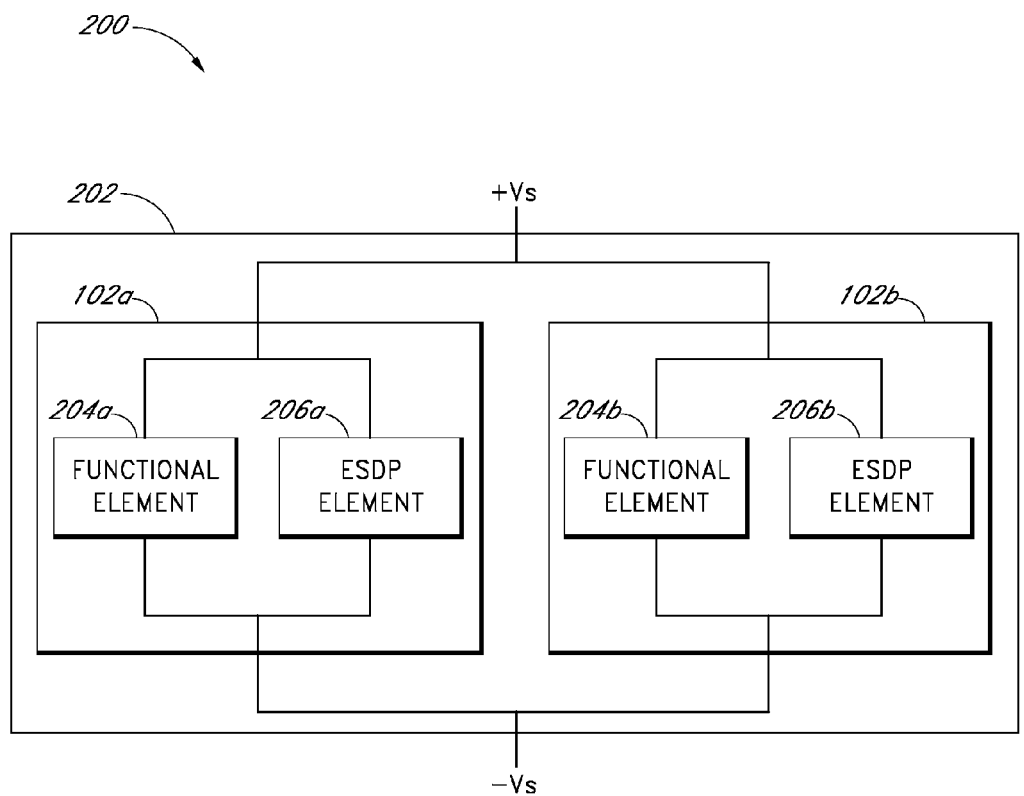
FIG. 2 is a schematic block diagram of an example integrated circuit assembly in which one integrated circuit is protected from electrical overstress/electrostatic discharge (EOS/ESD) events by another integrated circuit.

FIG. 2 is a schematic block diagram of electrical components of an IC assembly 200 that includes the IC package 202 within which one IC die is protected from EOS/ESD events by another IC die. The IC package 202 includes a first IC die 102a and a second IC die 102b connected in parallel. The top connections in the schematic diagram of the first IC die 102a and the second IC die 102b are connected to a positive power supply voltage or rail +Vs, and the bottom connections in the schematic diagram of the first IC die 102a and the second IC die 102b are connected to a negative power supply voltage or rail −Vs. It will be understood that "top" and "bottom" are schematic representations in FIGS. 2-8 and do not necessarily refer to physical locations or orientations on a particular die. The first IC die 102a includes a first functional element 204a and a first ESDP element 206a connected in parallel. The second IC die 102b includes a second functional element 204b and a second ESDP element 206b connected in parallel.

The first and second functional elements 204a, 204b can include one or more active circuit components, such as transistors, in addition to one or more optional passive circuit components, such as resistors, capacitors, or inductors. The first and second functional elements 204a, 204b can enable each IC die to perform one or more functions, for example, as an amplifier, an oscillator, a mixer, a filter, a phase-locked loop, a modulator, a demodulator, an encoder, a decoder, signal processor, an equalizer, a receiver, a transmitter, a timer, a microprocessor, a memory, or a converter (for example, analog-to-digital convertor or digital-to-analog converter), or the like. In some embodiments, the features provided by the first and second functional elements 204a, 204b can be the commercially important reason for packaging the first and second IC dies 102a, 102b together in the IC package 202.

The first and second ESDP elements 206a, 206b can include one or more EOS/ESD protection components configured to enhance the reliability of individual IC dice and protect components from exposure to EOS/ESD events. For instance, the first ESDP element 206a can be configured to protect the first functional element 204a from exposure to a first type or severity of EOS/ESD event, and the second ESDP element 206b can be configured to protect the second functional element 204b from exposure to a second type or severity of EOS/ESD event. At least one of the first or second ESDP elements 206a, 206b can maintain the voltage level across the functional elements 204a, 204b within a predefined safe range by transitioning from a high-impedance state to a low-impedance state when the voltage of the EOS/ESD event reaches a trigger voltage. Thereafter, the at least one of the first or second ESDP elements 206a, 206b can shunt at least a portion of the current associated with the EOS/ESD event from the positive power supply voltage +Vs to the negative power supply voltage −Vs, or vice versa, before the voltage of a transient electrical event reaches a positive or negative failure voltage that can lead to one of the most common causes of IC die damage. In some embodiments, the positive power supply voltage +Vs or the negative power supply voltage −Vs can be electrically connected to a low impedance power low supply, such as ground.

In one embodiment, the protection components of the first ESDP element 206a have different EOS/ESD protection ratings than the protection components of the second ESDP element 206b. The EOS/ESD protection ratings can depend on characteristics of the EOS/ESD protection components such as the component response speed or timing (for example, sensing a change in voltage which may be faster than sensing a threshold voltage level), response accuracy (for example, whether the EOS/ESD event is indicated as present when the event is actually present), response trigger voltage (for example, higher voltage thresholds or sensitivity to positive and negative transient electrical events), and the like.

For example, in one embodiment, the first ESDP element 206a can have a better EOS/ESD protection capability or higher EOS/ESD protection rating than the second ESDP element 206b. The first ESDP element 206a may include an active transient triggered bipolar supply clamp fabricated using a SiGe process while the second ESDP element 206b may have been fabricated using a first generation bipolar process and provide more limited EOS/ESD protection. Advantageously, by respectively connecting the positive power supply voltages +Vs and negative power supply voltages −Vs of the first IC die 102a and the second IC die 102b, the second functional element 204b of the second IC die 102b can be protected from exposure to EOS/ESD events by the first ESDP element 206a of the first IC die 102a. Given the better EOS/ESD protection capability or higher EOS/ESD protection rating of the first ESDP element 206a, the first ESDP element 206a can shunt current caused by an EOS/ESD event away from the second functional element 204b before the second ESDP element 206b shunts the current caused by the EOS/ESD event. In addition, the second IC die 102b can accordingly receive increased protection from EOS/ESD events without degrading the power efficiency or packaging efficiency of the IC package 202 that includes both the first IC die 102a and the second IC die 102b.

Figure 3:
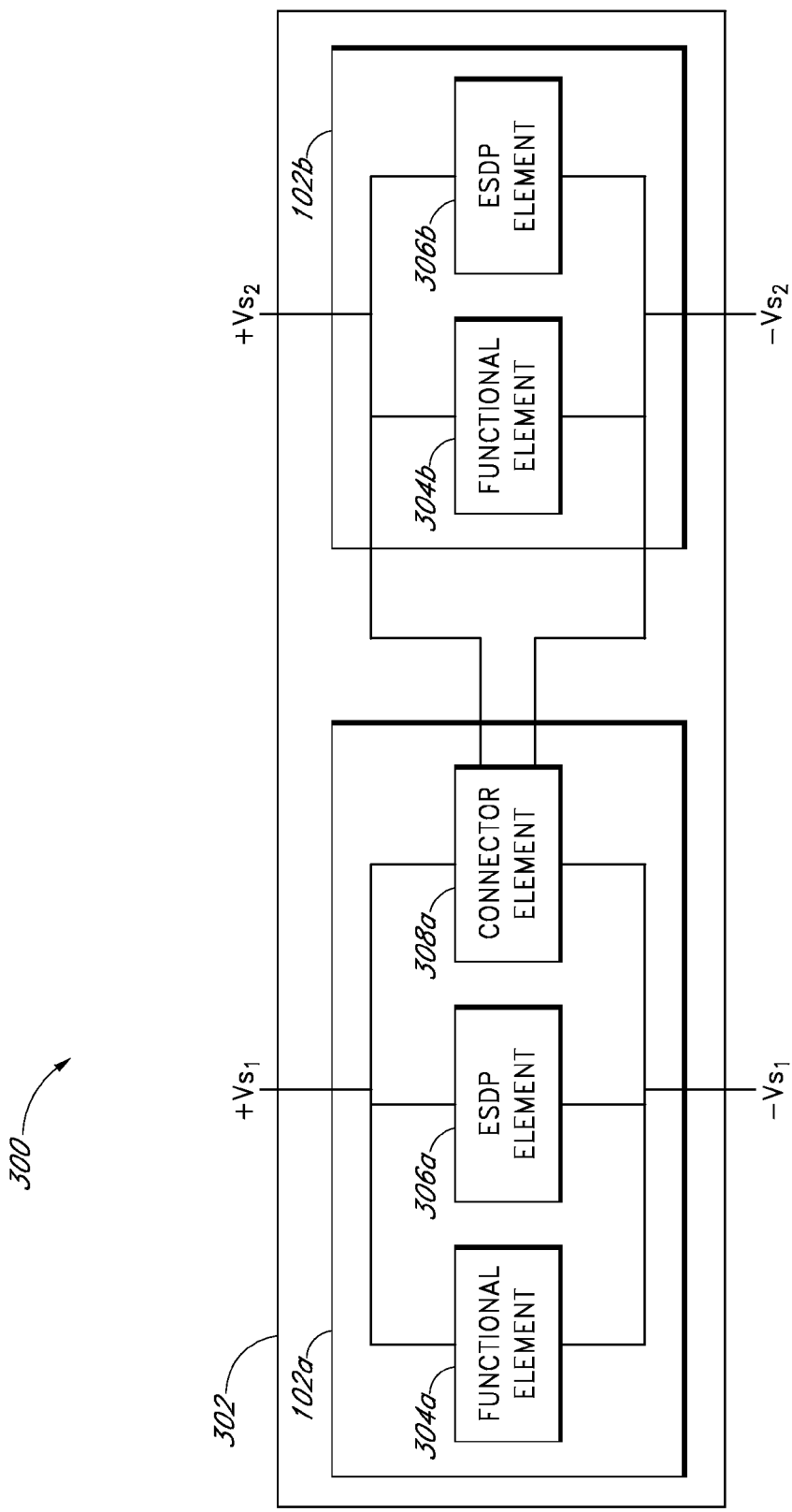
FIG. 3 is a schematic block diagram of another example integrated circuit assembly in which one integrated circuit of the integrated circuit assembly is protected from EOS/ESD events by another integrated circuit of the integrated circuit assembly.

FIG. 3 is a schematic block diagram of another example of an IC assembly 300 that includes an IC package 302 in which one IC is protected from EOS/ESD events by another IC. FIG. 3 is similar to FIG. 2 except that the first IC die 102a and the second IC die 102b are not connected in parallel. Instead, a connector element 308a of the first IC die 102a connects the first IC die 102a to the second IC die 102b.

In FIG. 3, the first IC die 102a includes a first functional element 304a, a first ESDP element 306a, and the connector element 308a, which are connected in parallel. The top connection in the schematic diagram of the first IC die 102a is connected to a first positive power supply voltage +Vs$_1$, and the bottom connection in the schematic diagram of the first IC die 102a is connected to a first negative power supply voltage −Vs$_1$. The second IC die 102b includes a second functional element 304b and second ESDP element 306b connected in parallel. The top connection in the schematic diagram of the second IC die 102b is connected to a second positive power supply voltage +Vs$_2$, and the bottom connection in the schematic diagram of the second IC die 102b is connected to a second negative power supply voltage −Vs$_2$. One output connection of the connector element 308a is connected to the second positive power supply voltage +Vs$_2$, and the other output connection of the connector element 308b is connected to the second negative power supply voltage −Vs$_2$.

Advantageously, the connector element 308a can enable the first IC die 102a and the second IC die 102b to share the first and second ESDP elements 306a, 306b even when the first IC die 102a and the second IC die 102b are configured to operate from different power supply voltages. In some embodiments, the connector element 308a includes one or more diodes, silicon-controlled rectifiers (SCRs), or transistors, such as bipolar junction transistors (BJTs). For instance, the connector element 308a can include two diodes in series, which are connected in parallel to two other diodes in series. Further, each output connection of the connector element 308a can be connected between the diodes of each set of two series diodes, and the one or more diodes can be configured to operate in a reverse-bias mode during normal operation. The first positive power supply voltage +Vs$_1$ may remain greater than or equal to the second positive power supply voltage +Vs$_2$ and the first negative power supply voltage −Vs$_1$ may remain less than or equal to the second negative power supply voltage −Vs$_2$. The connector element 308a can pass currents caused by EOS/ESD events between the first and second positive power supplies +Vs$_1$ and +Vs$_2$ and the first and second negative power supplies −Vs$_1$ and −Vs$_2$. The currents caused by the EOS/ESD events can then be shunted through either the first or second ESDP element 306a, 306b, depending on, for example, triggering characteristics, which can manifest in having better EOS/ESD protection capabilities or higher EOS/ESD protection ratings. In some embodiments, the number of diodes or transistors included in the connector element 308a can depend on the voltage difference between the different supply rails. In addition, in some embodiments, when the voltage difference between the different supply rails may be large, the connector element 308a can include one or more SCRs rather than one or more diodes or transistors since the one or more SCRs may offer a similar EOS/ESD protection capability or EOS/ESD protection rating as the one or more diodes or transistors in series while using less area of an IC die than may the one or more diodes or transistors. Connector elements will be described in greater detail later in connection with FIGS. 6, 7, and 8.

Figure 4:
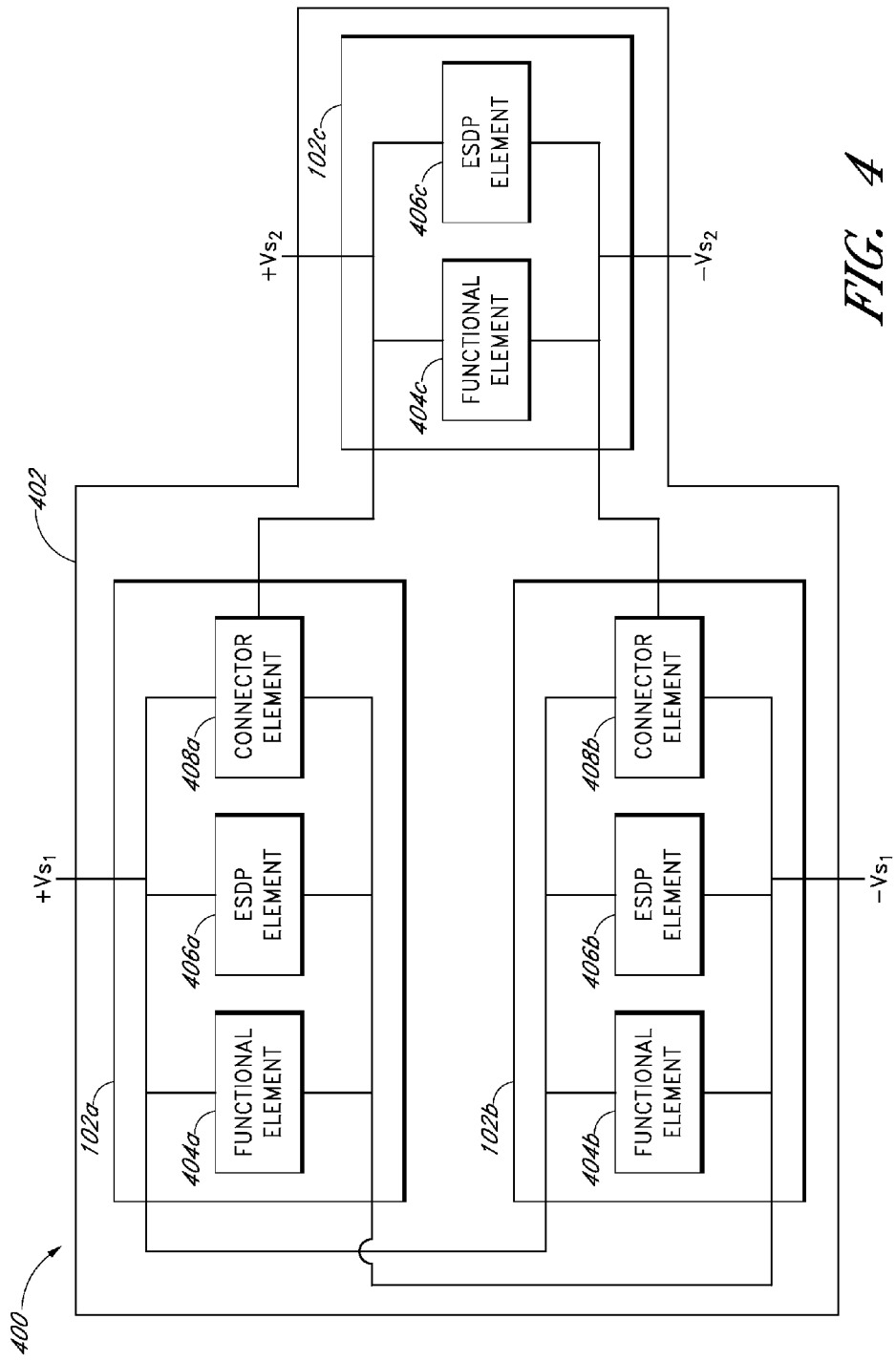
FIG. 4 is a schematic block diagram of an example integrated circuit assembly in which one integrated circuit of the integrated circuit assembly is protected from EOS/ESD events by more than one other integrated circuit of the integrated circuit assembly.

FIG. 4 is a schematic block diagram of an example of an IC assembly 400 that includes an IC package 402 in which one IC is protected from EOS/ESD events by more than one IC. FIG. 4 is similar to FIG. 3 except that three IC dice 102a, 102b, 103c are now included in the IC package 402 and two connector elements 408a, 408b connect to a third IC die 102c.

In FIG. 4, the first IC die 102a includes a first functional element 404a, a second ESDP element 406a, and the first connector element 408a, which are connected in parallel. Similarly, the second IC die 102b includes a second functional element 404b, a second ESDP element 406b, and the second connector element 408b, which are connected in parallel. The top connections in the schematic diagram of the first IC die 102a and the second IC die 102b are connected to a first positive power supply voltage +Vs$_1$, and the bottom connections in the schematic diagram of the first IC die 102a and the second IC die 102b are connected to a first negative power supply voltage −Vs$_1$. The third IC die 102c includes a functional element 404c and ESDP element 406c connected in parallel. The top connection in the schematic diagram of the third IC die 102c is connected to a second positive power supply voltage +Vs$_2$, and the bottom connection in the schematic diagram of the third IC die 102c is connected to a negative power supply voltage −Vs$_2$. The output connection of the first connector element 408a is connected to the second positive power supply voltage +Vs$_2$, and the output connection of the second connector element 408b is connected to the second negative power supply voltage −Vs$_2$.

Advantageously, the first and second connector elements 408a, 408b can enable the first IC die 102a, the second IC die 102b, and the third IC die 102c to share the ESDP elements 406a, 406b, and 406c when the first IC die 102a and the second IC die 102b are configured to operate from different power supply voltages than the third IC die 102c. In some embodiments, the first and second connector elements 408a, 408b include one or more diodes, silicon-controlled rectifiers (SCRs), or transistors, such as bipolar junction transistors (BJTs). For instance, each connector element can include two diodes connected in series. Further, the output connection of each connector element can be connected between the diodes of the set of two series diodes, and the one or more diodes can be configured to operate in a reverse-bias mode during normal operation. The first positive power supply voltage $+V_{s_1}$ may remain greater than or equal to the second positive power supply voltage $+V_{s_2}$ and the first negative power supply voltage $-V_{s_1}$ may remain less than or equal to the second negative power supply voltage $-V_{s_2}$. The first and second connector elements 408a, 408b can pass current caused by EOS/ESD events between the positive power supplies voltages $+V_{s_1}$ and $+V_{s_2}$ and the negative power supplies voltages $-V_{s_1}$ and $-V_{s_2}$. The current caused by the EOS/ESD events can then be shunted through one or more of the ESDP elements 406a, 406b, or 406c, depending on, for example, triggering characteristics that can manifest in having better EOS/ESD protection capabilities or higher EOS/ESD protection ratings. In some embodiments, the number of diodes or transistors included in the first and second connector elements 408a, 408b can depend on the voltage difference between the different supply rails. In addition, in some embodiments, when the voltage difference between the different supply rails may be large, the first and second connector elements 408a, 408b can include one or more SCRs rather than one or more diodes or transistors since the one or more SCRs may offer a similar EOS/ESD protection capability or EOS/ESD protection rating as the one or more diodes or transistors in series while using less area of an IC die than may the one or more diodes or transistors.

Figure 5:
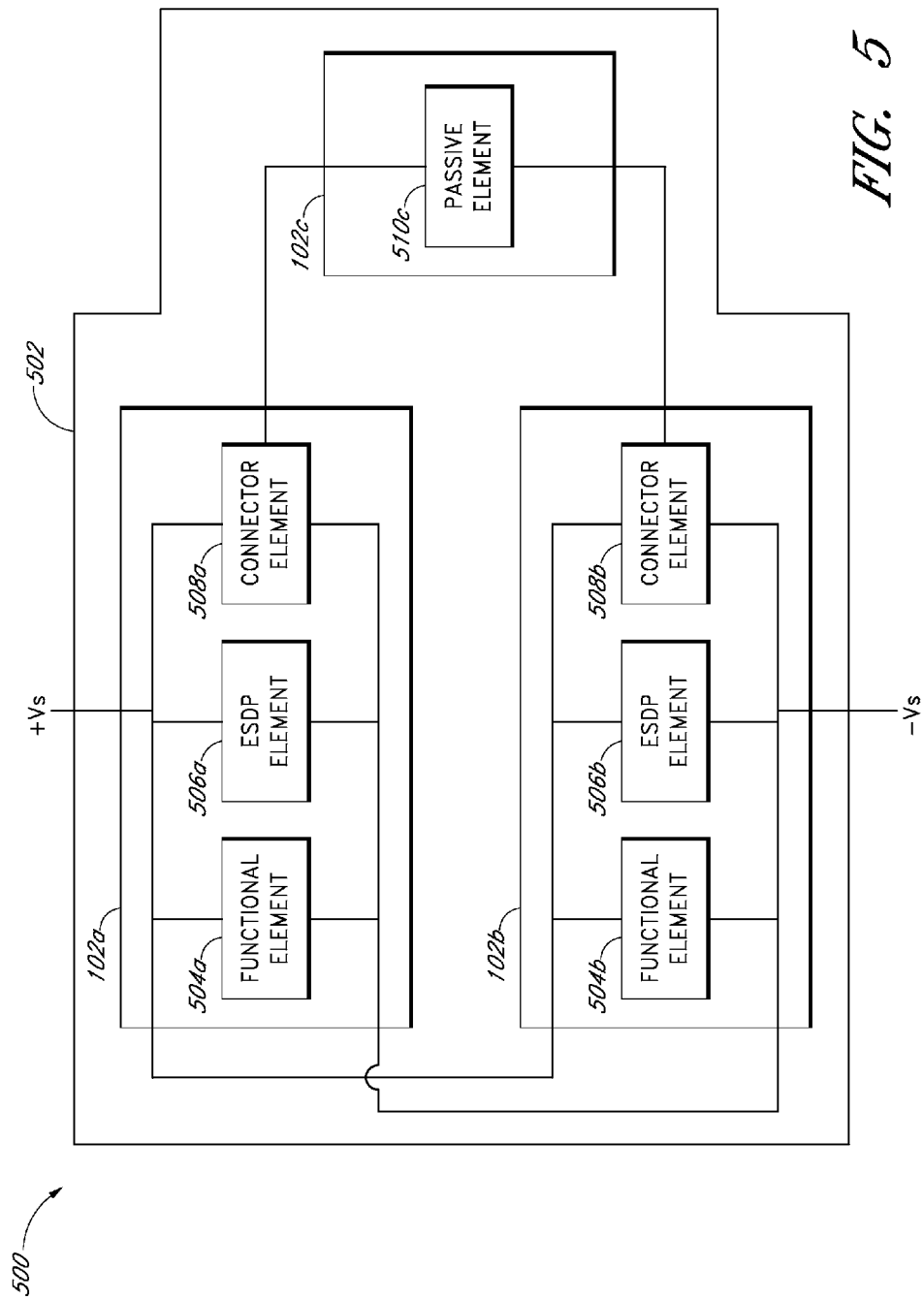
FIG. 5 is a schematic block diagram of another example integrated circuit assembly in which one integrated circuit of the integrated circuit assembly is protected from EOS/ESD events by more than one other integrated circuit of the integrated circuit assembly.

FIG. 5 is a schematic block diagram of another example of an IC assembly 500 that includes an IC package 502 in which one IC is protected from EOS/ESD events by more than one IC. FIG. 5 is similar to FIG. 4 except that the third IC die 102c includes a passive element 510c rather than the third functional element 404c and the third ESDP element 406c. The configuration of FIG. 5 can be advantageous when the third IC die 102c is connected to one or more external connections of the IC package 502 so that the third IC die 102c can be provided with protection from exposure to EOS/ESD events.

In FIG. 5, the first IC die 102a includes a first functional element 504a, a first ESDP element 506a, and a first connector element 508a, which are connected in parallel. Similarly, the second IC die 102b includes a second functional element 504b, a second ESDP element 506b, and a second connector element 508b, which are connected in parallel. The top connections in the schematic diagram of the first IC die 102a and the second IC die 102b are connected to a positive power supply voltage +Vs, and the bottom connections in the schematic diagram of the first IC die 102a and the second IC die 102b are connected to a negative power supply voltage −Vs. The third IC die 102c includes the passive element 510c, such as an integrated passive device (IPD). The top connection in the schematic diagram of the third IC die 102c is connected to the output connection of the connector element 508a, and the bottom connection in the schematic diagram of the third IC die 102c is connected to the output connection of the connector element 508b.

Advantageously, the first and second connector elements 508a, 508b can enable the first IC die 102a, the second IC die 102b, and the third IC die 102c to share the first and second ESDP elements 506a, 506b. In some embodiments, the first and second connector elements 508a, 508b include one or more diodes, silicon-controlled rectifiers (SCRs), or transistors, such as bipolar junction transistors (BJTs). For instance, each connector element can include two diodes in series, and the output connection of the connector element can be connected to between the two diodes. The one or more diodes or transistors can be configured to operate in a reverse-bias mode during normal operation. The one or more diodes or transistors can pass current caused by EOS/ESD events between the positive power supply voltage +Vs and the negative power supply voltage −Vs, and vice versa. The current caused by the EOS/ESD events can then be shunted through any one or more of the ESDP elements 506a, 506b, depending on which one or more elements have better EOS/ESD protection capabilities or higher EOS/ESD protection ratings. As another example, each connector element can include one or more SCRs configured to be turned on or off. When the one or more SCRs may be turned off during normal operation, the one or more SCRs can, for example, pass current caused by the EOS/ESD events between the output connections of the first or second connector element 508a, 508b and the negative power supply voltage −Vs.

Circuit Diagram Integrated Circuit Embodiments

Figure 6:
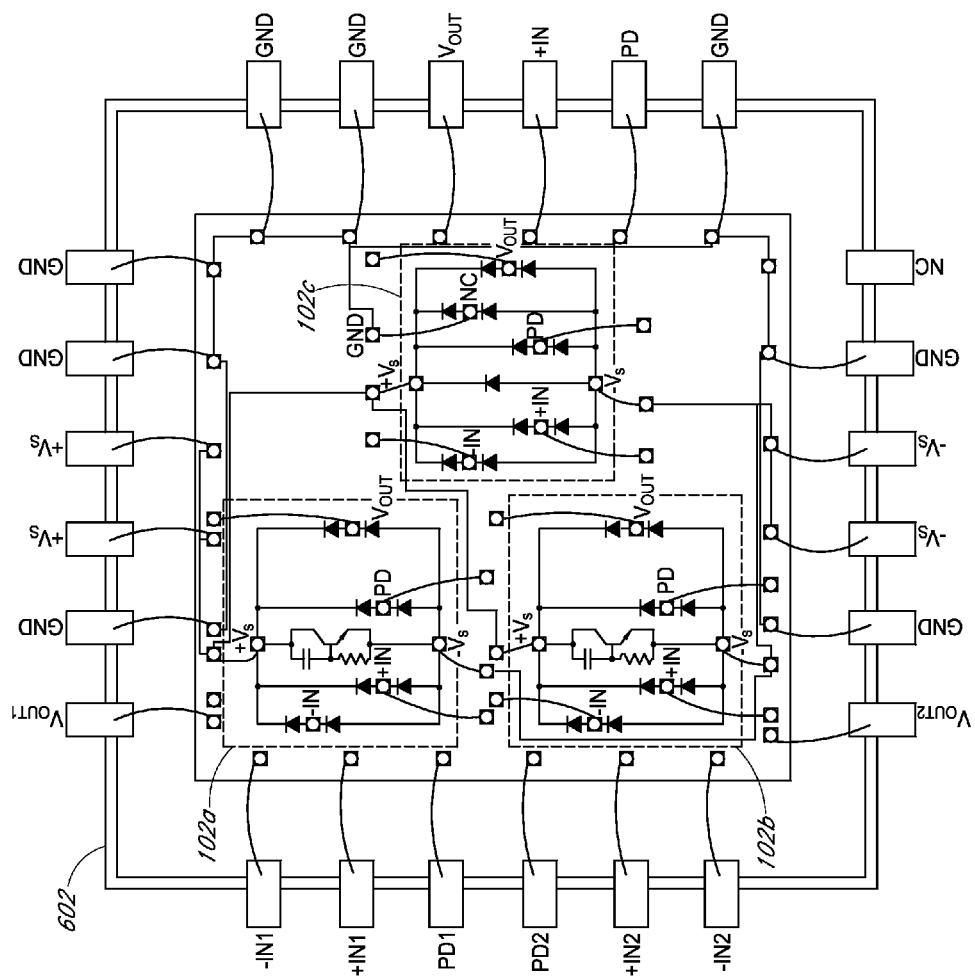
FIG. 6 illustrates a layout and a circuit diagram of an example of an integrated circuit assembly that includes an integrated circuit package wherein one integrated circuit of the integrated circuit assembly is protected from EOS/ESD events by more than one other integrated circuit of the integrated circuit assembly.

FIG. 6 illustrates a layout and a circuit diagram of an example of an IC assembly that includes an IC package 602 wherein one IC die is protected from EOS/ESD events by more than one IC die. The circuit diagram embodiment of FIG. 6 can correspond to the schematic block diagram embodiment of FIG. 2 wherein IC die are connected in parallel with electrically coupled power supply connections. The IC package 602 of FIG. 6 encapsulates a first IC die 102a, a second IC die 102b, and a third IC die 102c connected in parallel. The top connections in the schematic of FIG. 6 of the first IC die 102a, the second IC die 102b, and the third IC die 102c are electrically coupled to a source of a positive power supply voltage or rail +Vs with bond wires. It will be understood that "top" and "bottom" with respect to the first, second, and third dice 102a, 102b, 102c are merely schematic representations and do not necessarily refer to physical locations or orientations on a particular die. The bottom connections of the first IC die 102a, the second IC die 102b, and the third IC die 102c are electrically coupled to a source of a negative power supply voltage or rail −Vs with bond wires. The source for the rail +Vs or the rail −Vs can be, for example, a trace or a plane in a circuit board within the IC package 602, which in turn can be connected to a pin for connection outside the IC package 602. The first IC die 102a and the second IC die 102b include functional elements and ESDP elements connected in parallel. The third IC die 102c includes a functional element and an ESDP element connected in parallel.

In one non-limiting example, the functional elements of the first IC die 102a and the second IC die 102b can correspond to high speed amplifiers (HSAs), and the functional element of the third IC die 102c can correspond to a current feedback amplifier (CFA). In one example, each ESDP element of both the first IC die 102a and the second IC die 102b can be an active transient triggered bipolar supply clamp fabricated using a SiGe process. The active transient triggered bipolar supply clamps can be triggered to shunt current in response to a change in voltage over time. In addition, the active transient triggered bipolar supply clamps can include a current amplification feature to amplify a current discharge capability, decrease on-state resistance, and enable a full current discharge between positive and negative supplies. The ESDP element of the third IC die 102c can be a reverse biased diode fabricated using a first generation bipolar process, relying on diode junction breakdown for the EOS/ESD protection. As a result, the ESDP element of the third IC die 102c can provide more limited EOS/ESD protection than the ESDP elements of the first IC die 102a and the second IC die 102b. Moreover, the ESDP elements of the first IC die 102a and the second IC die 102b can provide better EOS/ESD protection capabilities or higher EOS/ESD protection ratings than the ESDP element of the third IC die 102c.

Advantageously, the connected power supplies of the first IC die 102a, the second IC die 102b, and the third IC die 102c enable the IC dice to share ESDP elements. Because the ESDP elements of the first IC die 102a and the second IC die 102b can provide better EOS/ESD protection capabilities or higher EOS/ESD protection ratings, the current caused by EOS/ESD events can be shunted through the ESDP elements of the first IC die 102a or the second IC die 102b before the current may otherwise be shunted by the ESDP element of the third IC die 102c.

Figure 7:
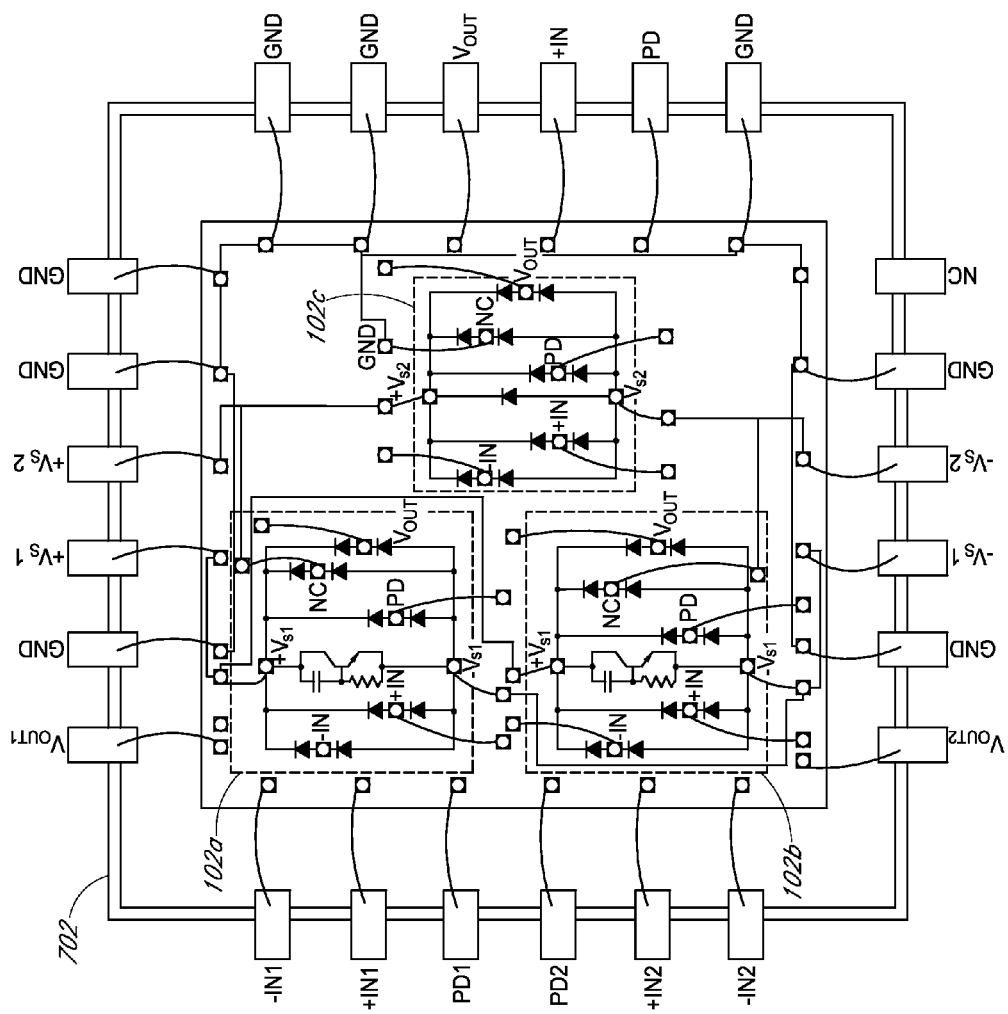
FIG. 7 illustrates a layout and a circuit diagram of another example of an integrated circuit assembly that includes an integrated circuit package where one integrated circuit of the integrated circuit assembly is protected from EOS/ESD events by more than one other integrated circuit of the integrated circuit assembly.

FIG. 7 illustrates a layout and a circuit diagram of another example of an IC assembly that includes an IC package 702 wherein one IC is protected from EOS/ESD events by more than one IC. The circuit diagram embodiment of FIG. 7 can correspond to the schematic block diagram embodiment of FIG. 4, wherein two IC die are connected in parallel with electrically coupled power supply connections, and further connected through connector elements to a third IC die.

The IC package 702 of FIG. 7 encapsulates a first IC die 102a, a second IC die 102b, and a third IC die 102c. The top connections of the first IC die 102a and the second IC die 102b are electrically coupled to a source of a positive power supply voltage or rail $+Vs_1$ with bond wires. The bottom connections of the first IC die 102a and the second IC die 102b are electrically coupled to a source of a negative power supply voltage or rail $-Vs_1$ with bond wires. The source for the rail +Vs or the rail -Vs can be, for example, a trace or a plane in a circuit board within the IC package 702, which in turn can be connected to a pin for connection outside the IC package 702. The first IC die 102a and the second IC die 102b include functional elements, ESDP elements, and connector elements (for example, shown as diodes in the illustrated example) connected in parallel. The third IC die 102c includes a functional element and an ESDP element connected in parallel. The top connection of the third IC die 102c is electrically coupled to a positive power supply voltage or rail $+Vs_2$ with bond wires. The bottom connection of the third IC die 102c is electrically coupled to a negative power supply voltage or rail $-Vs_2$ with bond wires. The output connections of the connector elements (sets of two diodes connected in series in the illustrated example) of the first IC die 102a and the second IC die 102b are connected to the positive power supply voltage $+Vs_2$ and the negative power supply voltage $-Vs_2$, respectively.

In some embodiments, the output connections of the connector elements can advantageously make use of otherwise unused pins, such as pins previously designated as "no connect" (NC) pins, extra pads, or dummy pads of one or more IC dice. Since a previously existing NC pin will ordinarily not be connected to functional elements of each IC die, the additional EOS/ESD protection should not detract from the performance or features of the one or more functional elements of the IC dice. Of course, after the previously designated NC pin is used for EOS/ESD protection, the pin should no longer be designated as a NC. When NC pins may not be available on one or more IC dice, IC die revisions can be carried out to incorporate an NC pin or bond pad, or an ESDP element can be incorporated under the NC pin or bond pad. Furthermore, the one or more NC pins can be referenced to ground using one or more SCRs or an up-down diode based approach to shunt the current from an EOS/ESD event away from one or more functional elements.

Advantageously, the connector elements of the first IC die 102a and the second IC die 102b enable the first IC die 102a, the second IC die 102b, and the third IC die 102c to share ESDP elements. Because the ESDP elements of the first IC die 102a and the second IC die 102b can provide better EOS/ESD protection capabilities or higher EOS/ESD protection ratings, the current caused by EOS/ESD events should be shunted through the ESDP elements of the first IC die 102a or the second IC die 102b before the current would otherwise be shunted by the ESDP element of the third IC die 102c.

Figure 8:
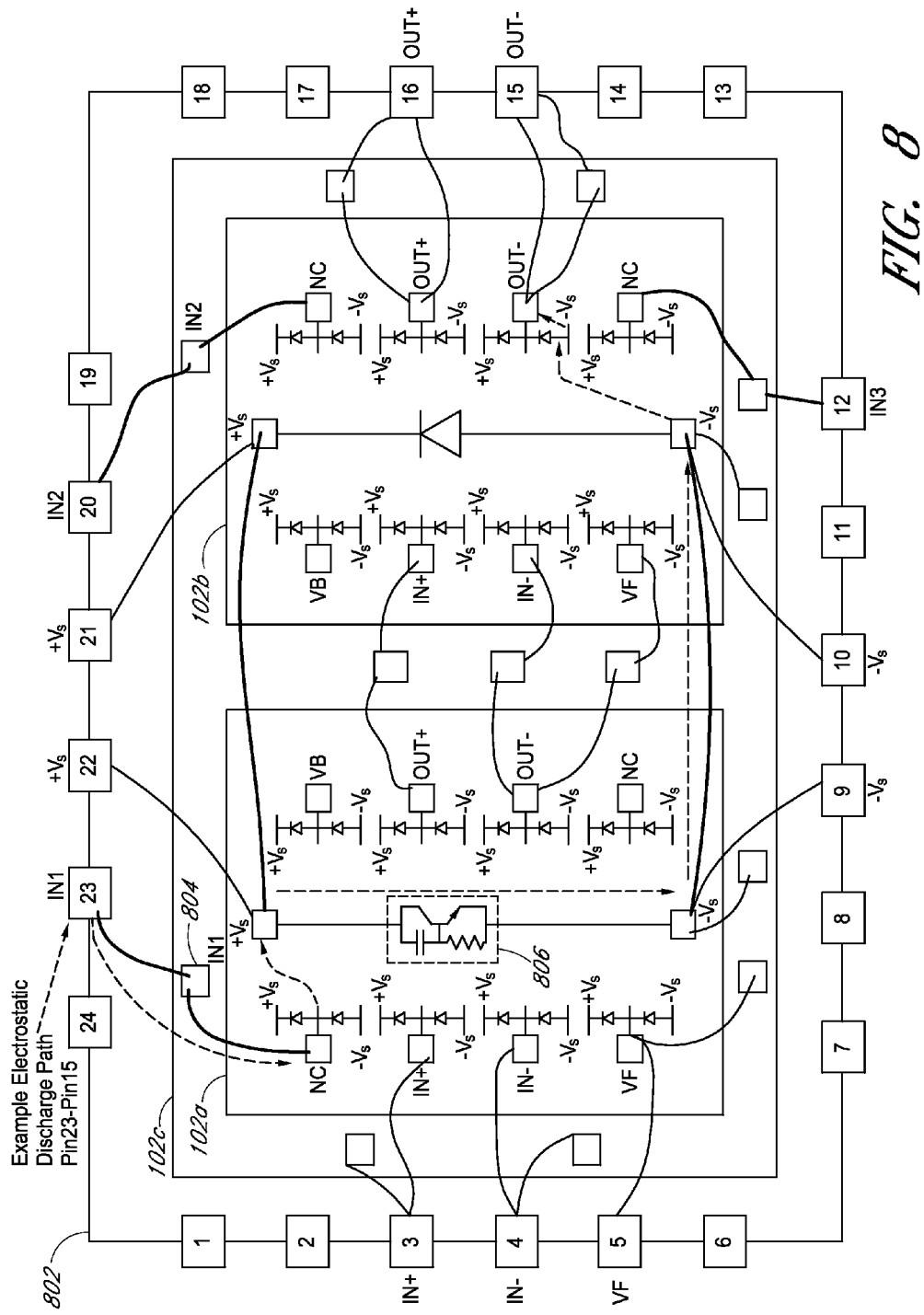
FIG. 8 is a circuit diagram of an example integrated circuit assembly that includes multiple integrated circuits within the same package that illustrates an ESD path from one pin of the package to another pin of the package.

FIG. 8 illustrates a layout and a circuit diagram of an example of an IC assembly that includes an IC package 802 that illustrates an ESD path from one pin of the IC package 802 to another pin of the IC package 802. The circuit diagram embodiment of FIG. 8 can correspond to the schematic block diagram embodiment of FIG. 5, wherein two IC die are connected in parallel with electrically coupled power supply connections and further connected through connector elements to a third IC die. As discussed with regards to FIG. 5, the configuration of FIG. 8 can be advantageous when the third IC die 102c is connected to one or more external connections of the IC package 802 (for example, such as through pin 12, pin 20, or pin 23 as illustrated in FIG. 8) so that the third IC die 102c is provided protection from exposure to EOS/ESD events.

The IC package 802 of FIG. 8 encapsulates a first IC die 102a, a second IC die 102b, and a third IC die 102c. In the illustrated configuration, the first die 102a and the second die 102b are stacked on top of the third die 102c. The top connections of the first IC die 102a and the second IC die 102b are electrically coupled to a source of a positive power supply voltage or rail +Vs with bond wires. The bottom connections of the first IC die 102a and the second IC die 102b are electrically coupled to a source of a negative power supply voltage or rail -Vs with bond wires. The source for the rail +Vs or the rail -Vs can be, for example, a trace or a plane in a circuit board within the IC package 602, which in turn can be connected to a pin for connection outside the IC package 602. In addition, it will be understood that "top" and "bottom" with respect to the first, second or third dice 102a, 102b, 102c are merely schematic representations and do not necessarily refer to physical locations or orientations on a particular die. The first IC die 102a and the second IC die 102b include functional elements, ESDP elements, and connector elements (for example, shown as diodes in the illustrated example) connected in parallel. The third IC die 102c includes an IPD and may not include an ESDP element. The top connection of the third IC die 102c is electrically coupled to the output connection of the connector element of the first IC die 102a, and the bottom connection of the third IC die 102c is electrically coupled to the output connection of the connector element of the second IC die 102b.

In some embodiments, the output connections of the connector elements can advantageously make use of otherwise unused pins, such as pins previously designated as NC pins, extra pads, or dummy pads of one or more IC dice. Since a previously existing NC pin will ordinarily not be connected to functional elements of each IC die, the additional EOS/ESD protection should not detract from the performance or features of the one or more functional elements of the IC dice. Of course, after the previously designated NC pin is used for EOS/ESD protection, the pin should no longer be designated as a NC. When NC pins may not be available on one or more IC dice, IC die revisions can be carried out to incorporate an NC pin or bond pad, or an ESDP element can be incorporated under the NC pin or bond pad. Furthermore, the one or more NC pins can be referenced to ground using one or more SCRs or an up-down diode based approach to shunt the current from an EOS/ESD event away from one or more functional elements.

Advantageously, the connector elements of the first IC die 102a and the second IC die 102b enable the first IC die 102a, the second IC die 102b, and the third IC die 102c to share ESDP elements. In the illustrated example, the ESDP element of the first IC die 102a can have better EOS/ESD protection capabilities or higher EOS/ESD protection ratings than the ESDP element of the second IC die 102*b*. As a result, the ESDP element of the first IC die 102*a* can shunt current caused by EOS/ESD events and away from the second IC die 102*b* and the third IC die 102*c*, in addition to shunting current away from the functional element of the first IC die 102*a*. This can permit the IC assembly to qualify for use for an application in which the second IC die 102*b* and the third IC die 102*c* would not otherwise meet. However, because the first IC die 102*a* and the second IC die 102*b*, and the third IC die 102*c* can share the ESDP elements, each IC die of the IC assembly can have a common EOS/ESD protection capability or EOS/ESD protection rating equal to the best EOS/ESD protection capability or highest EOS/ESD protection rating of the individual ESDP elements encapsulated in the IC package 802.

An example electrostatic discharge path is illustrated in FIG. 8. The electrostatic discharge path is shown as a series of dashed arrows tracing a path through components of the first IC die 102*a*, the second IC die 102*b*, and the third IC die 102*c*. Initially, the third IC die 102*c* is exposed to an electrostatic discharge via IN1 pin 23 of the IC package 802. The current caused by the electrostatic discharge travels from IN1 pin 23 to a pad 804 of the third IC die 102*c*. The current then travels from the third IC die 102*c* to a NC pin of the first IC die 102*a*. Next, the current moves through the closest diode to the positive power supply +Vs. The ESDP element 806 of the first IC die 102*a* then shunts the current to the negative power supply −Vs. The current finally passes through a last diode to the OUT− pin 15 of the IC package 802. As can be seen, the ESDP element of the first IC die 102*a* effectively protected both the second IC die 102*b* and the third IC die 102*c* from damage due to current caused by the electrostatic discharge.

Packaging Process Embodiment

Figure 9:
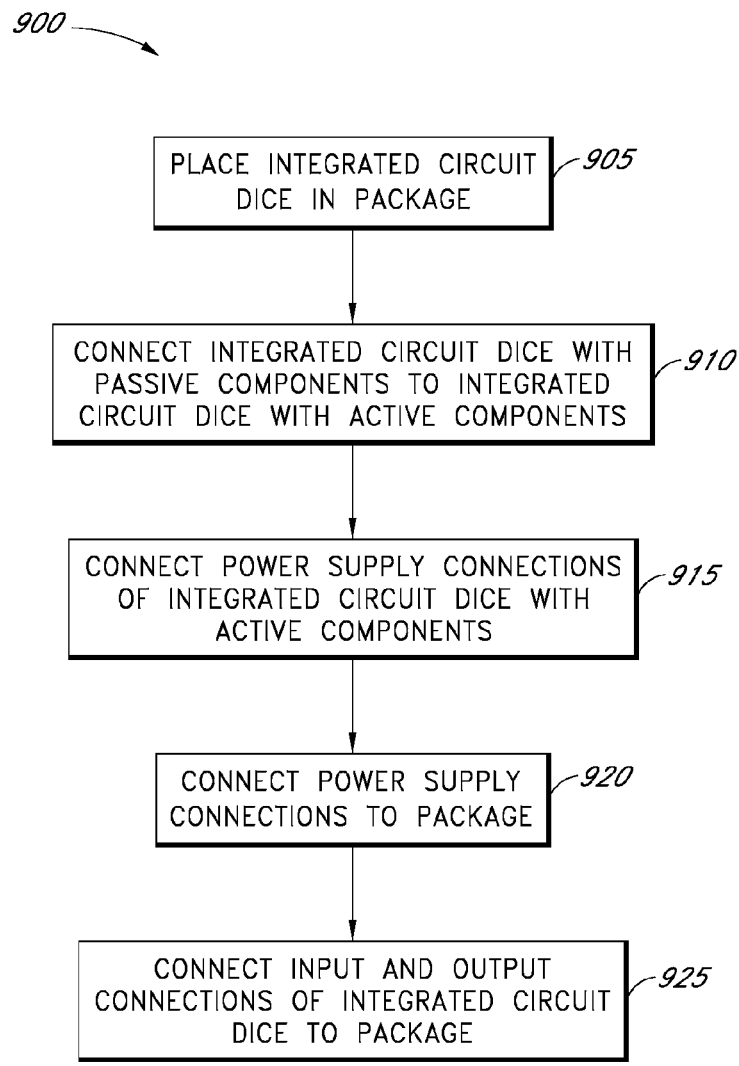
FIG. 9 is an embodiment of a process for placing integrated circuit dice in a package.

FIG. 9 is an embodiment of a process 900 for placing IC dice in an IC package. To place the IC dice in the IC package, the IC dice and package can be handled so as to reduce the likelihood of EOS/ESD events harming one or more IC dice. In particular, the IC dice and package can be handled so that ESDP elements of the one or more IC dice are connected and shared between IC dice, as discussed in this disclosure, before the IC dice are connected to pins of the IC package. Accordingly, the IC dice can be protected from EOS/ESD events via pins of the IC package before the IC dice are connected to pins of the IC package.

At block 905, the IC dice are placed in the IC package. At block 910, the IC dice with passive components are connected to IC dice with active components. For example, the third IC die 102*c* of FIG. 8 can be connected to the first IC die 102*a* and second IC die 102*b* of FIG. 8. At block 915, the power supply connections of the IC dice with active components are connected. For instance, the +$V_s$ pins of the first IC die 102*a* and the second IC die 102*b* of FIG. 8 can be connected with bond wire as illustrated in FIG. 8. At block 920, the power supply connections are connected to the IC package. For example, the +$V_s$ pin of the first IC die 102*a* of FIG. 8 can be connected to +$V_s$ pin 22 of the IC package 802 of FIG. 8, and the +$V_s$ pin of the second IC die 102*b* can be connected to +$V_s$ pin 21 of the IC package 802 of FIG. 8. In addition, the ground leads of the IC package can be connected to the one or more IC dies of the IC package. At block 925, the input and output connections of the IC dice are connected to the IC package. For instance, the IN+ and IN− pins of the first IC die 102*a* and input pins of the third IC die 102*c* of FIG. 8 can be connected to IN+ pin 3 and IN− pin 4 of the IC package 802, and the OUT− and OUT+ pins of the second IC die 102*b* and output pins of the third IC die 102*c* of FIG. 8 can be connected to OUT− pin 15 and OUT+ pin 16 of the IC package of FIG. 8.

In some embodiments, the input and output pins of the IC die having better EOS/ESD protection capabilities or higher EOS/ESD protection ratings than other IC dice can be connected first.

Applications

Although some systems have been illustrated above as including two or three IC dies and each die having one or no ESDP elements, more or fewer IC dice and ESDP elements can be included to meet system specifications.

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a package encompassing at least a first integrated circuit die and a second integrated circuit die;
   the first integrated circuit die attached to the package, the first integrated circuit die comprising functional integrated circuits and one or more electrical overstress/electrostatic discharge (EOS/ESD) protection circuits; and
   the second integrated circuit die attached to the package, the second integrated circuit die electrically coupled to the first integrated circuit die such that at least one component of the second integrated circuit die is protected from EOS/ESD by at least one of the one or more EOS/

ESD protection circuits of the first integrated circuit die, the second integrated circuit die being an integrated passive devices die without functional integrated circuits.

2. The apparatus of claim 1, wherein the second integrated circuit die does not comprise its own one or more EOS/ESD protection circuits.

3. The apparatus of claim 1, wherein each of at least some of the functional integrated circuits of the first integrated circuit die comprises an amplifier, an oscillator, a mixer, a filter, a phase-locked loop, a modulator, a demodulator, an encoder, a decoder, signal processor, an equalizer, a receiver, a transmitter, a timer, a microprocessor, a memory, or a converter.

4. The apparatus of claim 1, wherein the second integrated circuit die is electrically coupled to the first integrated circuit die via an input of the first integrated circuit die such that coupling of the second integrated circuit die to the input does not alter a functionality of the functional integrated circuits of the first integrated circuit die.

5. The apparatus of claim 1, wherein the second integrated circuit die is electrically coupled to the first integrated circuit die with bond wires.

6. The apparatus of claim 1:
wherein the package further encompasses a third integrated circuit die;
wherein the third integrated circuit die is attached to the package, the third integrated circuit die comprising functional integrated circuits and one or more EOS/ESD protection circuits, the second integrated circuit electrically coupled to the third integrated circuit die such that at least one component of the second integrated circuit die is protected from EOS/ESD by at least one of the one or more EOS/ESD protection circuits of the third integrated circuit die; and
wherein power supply connections of the third integrated circuit die are electrically coupled to the first integrated circuit die.

7. The apparatus of claim 6, wherein the power supply connections of the third integrated circuit die are electrically coupled to power supply connections of the first integrated circuit die with bond wires.

8. The apparatus of claim 6, wherein the power supply connections of the third integrated circuit die are electrically coupled to power supply connections of the first integrated circuit die with one or more diodes or one or more silicon-controlled rectifiers.

9. The apparatus of claim 8, wherein the power supply connections of the first integrated circuit die are configured to operate at first voltages, and the power supply connections of the third integrated circuit die are configured to operate at second voltages different than the first voltages.

10. The apparatus of claim 9, wherein the power supply connections of the third integrated circuit die are electrically coupled to the power supply connections of the first integrated circuit die with one or more diodes, the one or more diodes being configured to operate in reverse-bias mode.

11. A method of providing protection from electrical overstress/electrostatic discharge (EOS/ESD), the method comprising:
assembling at least a first integrated circuit die and a second integrated circuit die within a common package, the first integrated circuit die comprising functional integrated circuits and one or more EOS/ESD protection circuits, the second integrated circuit die being an integrated passive devices die without functional integrated circuits; and
protecting at least one component of the second integrated circuit die from EOS/ESD with at least one of the one or more EOS/ESD protection circuits of the first integrated circuit die.

12. The method of claim 11, wherein the second integrated circuit die does not comprise its own one or more EOS/ESD protection circuits.

13. The method of claim 11, wherein each of at least some of the functional integrated circuits of the first integrated circuit die comprises an amplifier, an oscillator, a mixer, a filter, a phase-locked loop, a modulator, a demodulator, an encoder, a decoder, signal processor, an equalizer, a receiver, a transmitter, a timer, a microprocessor, a memory, or a converter.

14. The method of claim 11, wherein the second integrated circuit die is electrically coupled to the first integrated circuit die via an input of the first integrated circuit die such that coupling of further comprises an integrated circuit die to the input does not alter a functionality of the functional integrated circuits of the first integrated circuit die.

15. The method of claim 11, wherein the second integrated circuit die is electrically coupled to the first integrated circuit die with bond wires.

16. The method of claim 11:
wherein said assembling further comprises assembling a third integrated circuit die within the common package, the third integrated circuit die comprising functional integrated circuits and one or more EOS/ESD protection circuits;
wherein said protecting comprises protecting at least one component of the second integrated circuit die from EOS/ESD with at least one of the one or more EOS/ESD protection circuits of the third integrated circuit die; and
wherein power supply connections of the third integrated circuit die are electrically coupled to the first integrated circuit die.

17. The method of claim 16, wherein the power supply connections of the third integrated circuit die are electrically coupled to power supply connections of the first integrated circuit die with bond wires.

18. The method of claim 16, wherein the power supply connections of the third integrated circuit die are electrically coupled to power supply connections of the first integrated circuit die with one or more diodes or one or more silicon-controlled rectifiers.

19. The method of claim 18, wherein the power supply connections of the first integrated circuit die are configured to operate at first voltages, and the power supply connections of the third integrated circuit die are configured to operate at second voltages different than the first voltages.

20. The method of claim 19, wherein the power supply connections of the third integrated circuit die are electrically coupled to the power supply connections of the integrated circuit die with one or more diodes, the one or more diodes being configured to operate in reverse-bias mode.

* * * * *

UNITED STATES PATENT AND TRADEMARK OFFICE
CERTIFICATE OF CORRECTION

| | | |
|---|---|---|
| PATENT NO. | : 9,076,807 B2 | Page 1 of 1 |
| APPLICATION NO. | : 13/610509 | |
| DATED | : July 7, 2015 | |
| INVENTOR(S) | : Parthasarathy et al. | |

It is certified that error appears in the above-identified patent and that said Letters Patent is hereby corrected as shown below:

In the claims,

In column 15 at line 30, in Claim 6, after "circuit" insert --die--.

In column 15 at line 56, in Claim 10, after "with" insert --the--.

In column 16 at line 23, in Claim 14, change "further comprises an" to --the second--.

In column 16 at line 59 (approx.), in Claim 20, after "connections of the" insert --first--.

In column 16 at line 60 (approx.), in Claim 20, after "with" insert --the--.

Signed and Sealed this
Eighth Day of March, 2016

Michelle K. Lee
*Director of the United States Patent and Trademark Office*